United States Patent [19]
Milic-Strkalj

[11] Patent Number: 6,015,740
[45] Date of Patent: Jan. 18, 2000

[54] METHOD OF FABRICATING CMOS DEVICES WITH ULTRA-SHALLOW JUNCTIONS AND REDUCED DRAIN AREA

[75] Inventor: Ognjen Milic-Strkalj, Burlingame, Calif.

[73] Assignee: Advanced Micro Devices, Inc., Sunnyvale, Calif.

[21] Appl. No.: 08/798,581

[22] Filed: Feb. 10, 1997

[51] Int. Cl.[7] .......................... H01L 21/336; H01L 21/22; H01L 21/38
[52] U.S. Cl. ............................... 438/300; 438/564
[58] Field of Search ..................... 438/300, 558, 438/564, FOR 322

[56] References Cited

U.S. PATENT DOCUMENTS

| | | | |
|---|---|---|---|
| 4,274,892 | 6/1981 | Templin | 438/564 |
| 4,301,588 | 11/1981 | Horng et al. | 438/564 |
| 5,156,994 | 10/1992 | Moslehi . | |
| 5,389,557 | 2/1995 | Jung-Suk . | |
| 5,397,722 | 3/1995 | Bashir et al. . | |
| 5,464,782 | 11/1995 | Koh . | |
| 5,496,750 | 3/1996 | Moslehi | 438/300 |
| 5,545,579 | 8/1996 | Liang et al. . | |
| 5,597,746 | 1/1997 | Prall | 438/300 |
| 5,683,924 | 11/1997 | Chan et al. | 438/300 |
| 5,766,998 | 6/1998 | Tseng | 438/291 |

FOREIGN PATENT DOCUMENTS

| | | |
|---|---|---|
| 0 287 385 A2 | 10/1988 | European Pat. Off. . |
| 0 422 824 A1 | 4/1991 | European Pat. Off. . |
| 0 747 941 A2 | 12/1996 | European Pat. Off. . |
| 2-201931A | 8/1990 | Japan .............. 438/FOR 322 |

OTHER PUBLICATIONS

G.E. Georgiou, T.T. et al., "Shallow Junctions by Out–Diffusion from $BF_2$ Implanted Polycrystalline Silicon", J. Appl. Phys. 68(7), pp. 3707–3713, Oct. 1, 1990.

*Primary Examiner*—Richard Booth

[57] ABSTRACT

A method of making a semiconductor device forms a gate on a substrate and provides a self-aligned diffusion source on the substrate, without the use of a mask. The diffusion source provides dopant material into the substrate. The self-aligning of the diffusion source avoids misalignment of the mask and improper doping. When the diffusion source is polysilicon or amorphous silicon, subsequent patterning and siliciding of the polysilicon forms silicided interconnect straps available for interconnecting devices on the semiconductor wafer.

18 Claims, 9 Drawing Sheets

METHOD OF FABRICATING CMOS DEVICES WITH ULTRA-SHALLOW JUNCTIONS AND REDUCED DRAIN AREA

TECHNICAL FIELD OF THE INVENTION

The present invention relates to the field of metal-oxide semiconductor devices, and in particular to a method of forming semiconductor devices with ultra-shallow junctions and reduced source and drain PN-junction areas.

BACKGROUND OF THE INVENTION

Metal-oxide semiconductor (MOS) devices are generally fabricated by repeated layering of deposited, or grown, and patterned layers that are masked and etched to provide microcircuits. However, minimum feature size requirements (usually determined by resolution of photolithography used in patterning) impose a need for long source and drain regions extending from edges of the gate outward to the field isolation (thick-oxide) layers. Most commonly, source and drain openings are three feature sizes long where one feature size (F) represents the minimum lithography resolution, and is equal to the gate length, as shown in FIG. 1. A conventional MOS device, having a drain area of approximately 3 feature sizes F. is depicted in FIG. 1. It should be noted that the device is fully symmetric. The device includes a gate electrode 10, a lightly doped region 12 of the drain, and a heavily doped region 14 of the drain. There is a thick field oxide 16, a silicide layer 18 and a contact plug 20.

More recently, there are numerous reports in the literature on devices having shorter source and drain openings. These devices reportedly have source-drain openings of 2 feature sizes. Therefore, there is a decreased junction area, and consequently junction capacitance is reduced by approximately 33% when compared to earlier conventional devices. One example is depicted in FIG. 2.

The silicide layer 18, which is used to "metallize" the doped source and drain regions and which is created by the reaction of the deposited metal and the underlying silicon, can only grow within the source-drain openings (on silicon), not on the oxide. An attempt to create a device with source-drain openings 1 feature size long, with the goal of further reducing junction area and capacitance, would cause the contact plugs to land on the oxide (an insulator) and lose contact with the silicide layers, rendering the device inoperable. This is shown in FIG. 3.

The spacing between two contact openings cannot be reduced to less than three feature sizes, because of mask alignment tolerance, which is typically of the order of half of one feature size.

With the advancement of semiconductor technology, devices are being constantly scaled down, with the goal of increasing speed and packing density. The scaling trend is such that all device dimensions are being scaled (reduced) simultaneously by approximately same scaling factor. The depth of source and drain junctions needs to be reduced as well as gate length. However, production of shallow junctions is becoming a problem because of several factors. In a typical manufacturing process, source and drain openings are doped with ion-implantation, a process in which dopant ions are accelerated by an electric field and "shot" into the underlying silicon. In the past, the depth of the implanted profile, and consequently the depth of source and drain junctions, was controlled by acceleration energy. However, as the energy is reduced, the depth of profile does not continue to scale down proportionately with implant energy. Furthermore, as the implant energy is decreased even further, a larger proportion of implanted ions will experience elastic scattering with silicon atoms and simply be bounced back, not entering the silicon. It has been noticed that for low energy implant, a significant fraction of the total implanted dose is stopped in a surface layer, for example, a native oxide film atop of the silicon. This results in dose loss and renders implantation inefficient.

Another problem has to do with the silicide layer. The silicide layer has to have a certain thickness to achieve low resistance path for electric current. On the other hand, the junctions should be as shallow as possible, as this improves certain device characteristics, most notably leakage current in the off-state. Therefore, shallow junctions are needed to improve device characteristics but at the same time, reasonably deep junctions are needed to prevent the growing silicide layer from punching-through the junction, i.e. silicide/silicon interface should not be deeper than the source/drain junction as that would short-circuit the device, rendering it inoperable.

Doped amorphous silicon (a-Si) or poly layer has been widely used in the manufacturing of polysilicon emitter bipolar junction transistors (BJTs) to create shallow junctions for over 20 years. The use of a deposited layer as the dopant source in the creation of MOS device source and drain regions is presented in Georgiou, J. Appl. Phys. 68 (7), 3707 (Oct. 1, 1990). FIG. 4 illustrates the structure of Georgiou, in which an extended region of P-poly 22 reaches from p-type diffusion regions 24 to metal plug connections 26 that connect to aluminum layers 28. As presented in the introduction to Georgiou, the P-poly 22 region is 3500–4000 Å thick. This structure has several limitations. Firstly, the source-drain opening area appears to be limited to 1.5-2 feature sizes, yielding significant junction capacitance and junction leakage when compared to sub 1 feature size devices. Furthermore, the thick polysilicon layer 22 adds resistance to the source and drain because current must flow from region 24 through 3000 Å of polysilicon to reach the silicide 25 on top of layer 22. Source/drain resistance impacts considerably the speed of the device. Furthermore, there is additional significant sidewall capacitance between the gate and source and the gate and drain, as source and drain layers 22 abut the gate 36 for its entire height and are separated by spacer 34. Sidewall capacitance in this device is relatively high. From the drawing by Georgiou, it appears that it is imperative to have a vertically sharply etched field oxide (32) opening. Another disadvantage of the device is that it is not readily producible by current field isolation methods, such as STI or LOCOS.

Although etching is not described in Georgiou, in order to clear the layer 22 on top of the gate 36 and expose the oxide spacers 34 (which then act as boundaries between the silicide on top of the gate and silicide 25 on top of layer 22) a mask is generally required. Furthermore, it is known that addition of lightly doped regions of source drain diffusions under the gate edge has beneficial effects on device performance and MOS devices manufactured today include lightly doped drain extensions (LDDs). The method described by Georgiou does not incorporate LDDs at all.

Providing extremely small diffusion regions with enough dopant atoms to achieve sufficient source/drain concentrations is also a problem at the sub-micron level. Diffusion is accomplished in certain technologies (such as bipolar) by depositing a doped layer of polysilicon (or amorphous silicon) on a substrate and annealing until the sufficient amount of dopants diffuse into the substrate. Control is established by limiting the concentrations of dopant in the surface layer and by controlling the amount of thermal energy supplied in the process. (The thermal energy is controlled by controlling both diffusion temperature and time.) Doping of substrate from a deposited doped layer has not been hitherto applied to CMOS technology, especially not to CMOS devices with LDD structures. Using out-diffusion techniques in sub-micron CMOS devices has not been accomplished in the prior art, due in part to the difficulties in precisely locating (aligning) the doped layer of polysilicon with respect to the gate because of mask misalignment.

SUMMARY OF THE INVENTION

There is a need for a method of manufacturing a metal-oxide semiconductor device with ultra-shallow junctions using polysilicon as a diffusion source, but without using a mask to align the polysilicon with respect to the gate of the semiconductor device.

This and other needs are met by an embodiment of the present invention which provides a method of forming a semiconductor device, comprising the steps of forming a gate on a substrate, forming a self-aligned diffusion source on the substrate, and diffusing dopant material into the substrate from the diffusion source. In certain embodiments, the step of forming a self-aligned diffusion source includes depositing oxide over the gate, and depositing at least one of polysilicon and amorphous silicon over the oxide, the oxide separating the polysilicon from the gate by an approximately equal amount on both sides of the gate.

Self-aligning the polysilicon with respect to the gate according to embodiments of the present invention allows a diffusion source to be precisely located with respect to the gate and source and drain regions. The technique of self-aligning avoids the use of additional masking steps to locate the diffusion sources symmetrically around the gate. This prevents possible misalignment of masks used in preceding processing steps, such as the mask used in forming the gate. Hence, the diffusion sources will be precisely located to supply dopant (by out-diffusion) to the source and drain regions of a semiconductor device, even for a very small metal-oxide semiconductor device with lightly doped drain structures.

Another advantage of the present invention is the ability to utilize the diffusion sources as interconnect straps between devices on the semiconductor wafer. The use of the difflusion sources as interconnect straps becomes possible after the out-diffusion process is performed, when polysilicon which has formed the diffusion sources is patterned and silicided to create silicide interconnect straps.

A still further advantage of the present invention is the reduced junction leakage and capacitance of the ultra-shallow junctions and reduced drain and source areas of the devices produced according to the method of the invention. This lowers power consumption and increases the speed of the devices manufactured according to the invention.

The present invention avoids the earlier-described punching-through the junction by the growing silicide layer. It does this in certain embodiments of the invention by depositing fully or almost fully consumable amorphous silicon (a-Si layer) or polycrystalline silicon (poly) layer that is self-aligned (i.e. without requiring an additional masking step) with respect to the gate. The method allows the creation of ultra-shallow junctions and a sufficiently thick silicide layer at the same time.

Embodiments of the invention provide a method of creating ultra-shallow junctions by diffusion of dopant from a self-aligned, consumable, deposited a-Si layer or a poly layer. Upon serving as a source for dopant, this layer is fully or almost fully consumed by silicide. Silicide layers form conductive layers on top of the thick (field) oxide, thus allowing contact plugs to land on the silicide and form a good electrical connection.

The foregoing and other features, aspects and advantages of the present invention will become more apparent from the following detailed description of the present invention when taken in conjunction with the accompanying drawings.

DETAILED DESCRIPTION OF THE DRAWINGS

Figure 25:
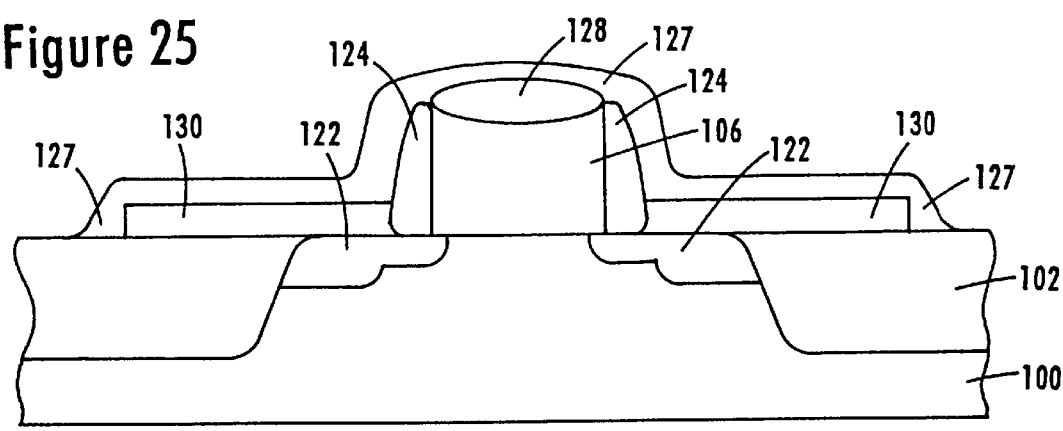
FIG. 25 depicts the semiconductor die wafer of FIG. 24 after silicide is grown.
Figure 26:
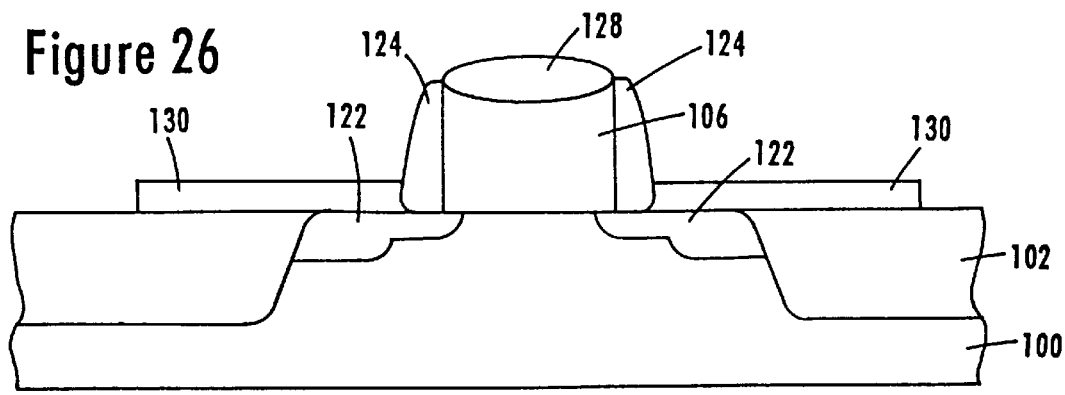
FIG. 26 depicts the semiconductor die wafer of FIG. 25 after the metal layer is removed.

FIGS. 5–26 all depict a cross-section of a semiconductor die wafer during various stages of manufacture, in accordance with an embodiment of the present invention. Previous processing steps to reach the structure depicted in FIG. 5, and further processing steps after the structure achieved in FIG. 26, are not depicted. However, these pre-processing steps (and post-processing steps) may be performed in a conventional manner. As will become apparent from the following description, the present invention creates shallow junctions by out-diffusion from polysilicon for MOS devices. Since the source and drain are much shallower, there is a reduced punch-through leakage and because area of the source and drain junctions is reduced, so is junction capacitance. Also, as will become apparent from the following description, a self-aligned technique is used to deposit layers so that no mask is needed to create the source and drain. Once the device has been formed according to the present invention, the sources of diffusion remain on the device and after being fully or near fully consumed by silicide act as interconnects between devices.

Figure 1:
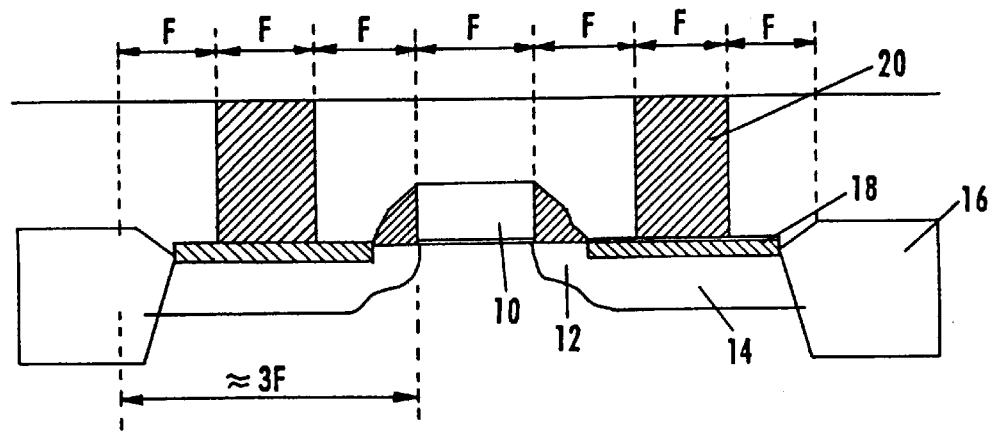
FIG. 1 is a cross-section of a semiconductor device constructed in accordance with a method of the prior art, having a drain area of approximately three feature sizes.
Figure 2:
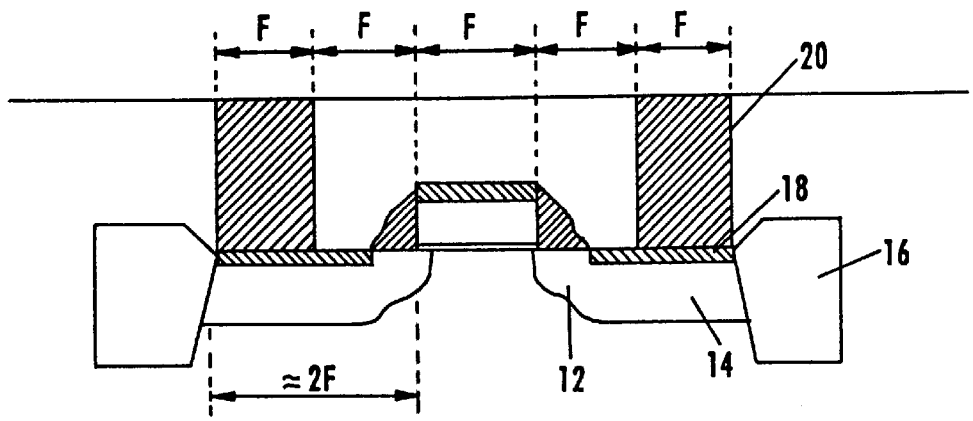
FIG. 2 is a cross-section similar to FIG. 1 of a prior art semiconductor device having source-drain openings of two feature sizes.
Figure 3:
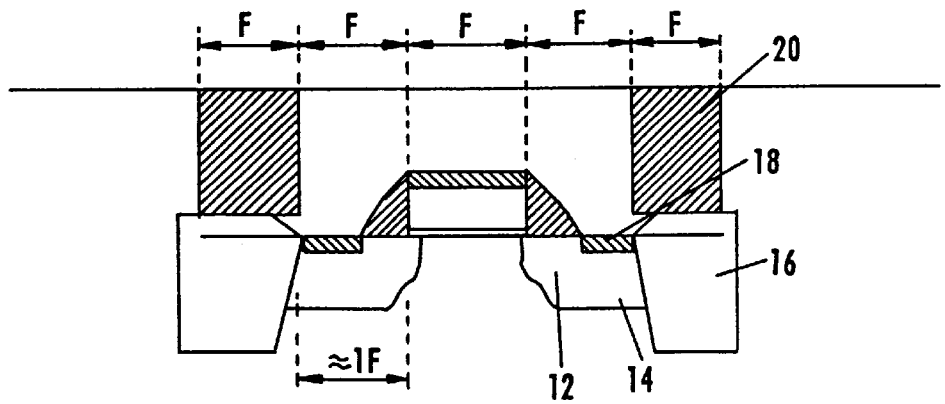
FIG. 3 is a cross-section similar to FIGS. 1 and 2, depicting an inoperable semiconductor device constructed in accordance with a prior art method.
Figure 4:
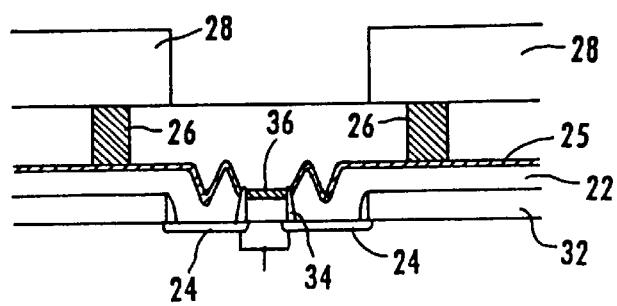
FIG. 4 is a cross-section of a semiconductor device constructed in accordance with a method of the prior art.
Figure 5:
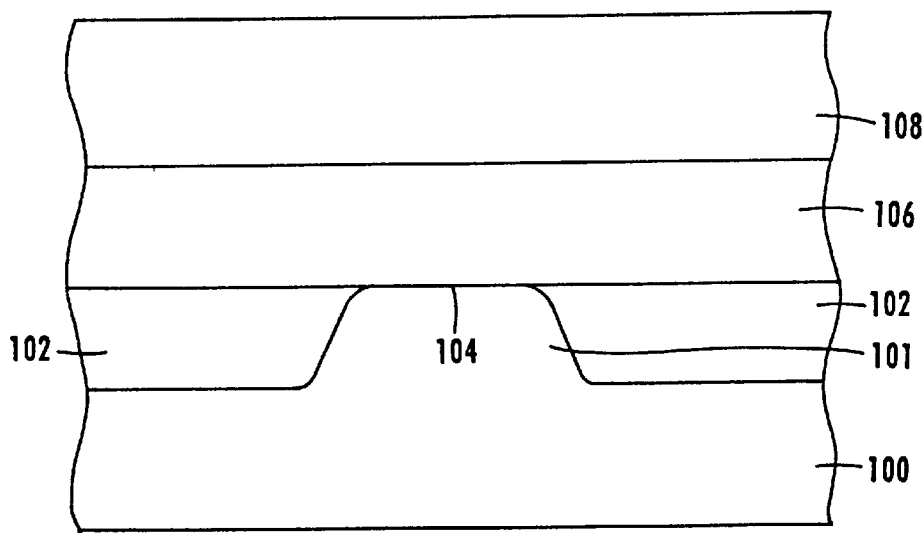
FIG. 5 is a cross-section of a semiconductor wafer used in the present invention.

FIG. 5 is a cross-section of a semiconductor die wafer having a substrate 100, into which a p-well has been formed (not depicted). The following description and figures depict the formation of a NMOS device. It will be apparent to those of ordinary skill in the art that the formation of an PMOS device will follow similar steps without departing from the spirit or scope of the present invention. Also, after various steps, a complete masking of the area is performed while manufacturing steps are performed on other types of devices (such as PMOS devices). These masking steps are not depicted as they do not form part of the invention.

A low-temperature oxide 102 is deposited in trenches formed on either side of active device region 101 in the substrate 100. A thin gate oxide layer 104 is grown on the exposed substrate 100. A polysilicon layer 106 is on top of the gate oxide layer 104, and a relatively thick nitride layer 108 is deposited on the polysilicon layer 106. Alternatively, for better adhesion of nitride layer, polysilicon can be oxidized, or a thin oxide layer can be deposited atop of poly before nitride 108 is deposited. All of the steps performed to form the structure depicted in FIG. 5 are conventional.

Figure 6:
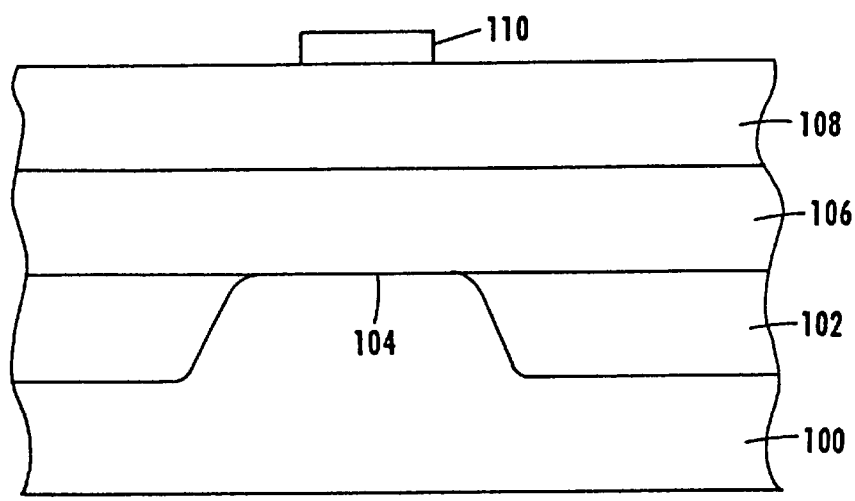
FIG. 6 is a cross-section of the semiconductor wafer of FIG. 5 with a mask placed over a gate region.
Figure 7:
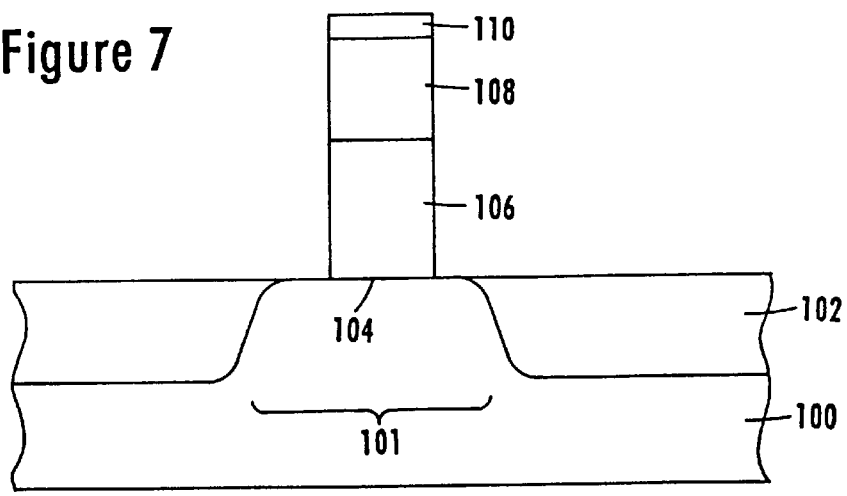
FIG. 7 depicts the semiconductor die wafer of FIG. 6 after etching of the nitride and polysilicon layers.
Figure 8:
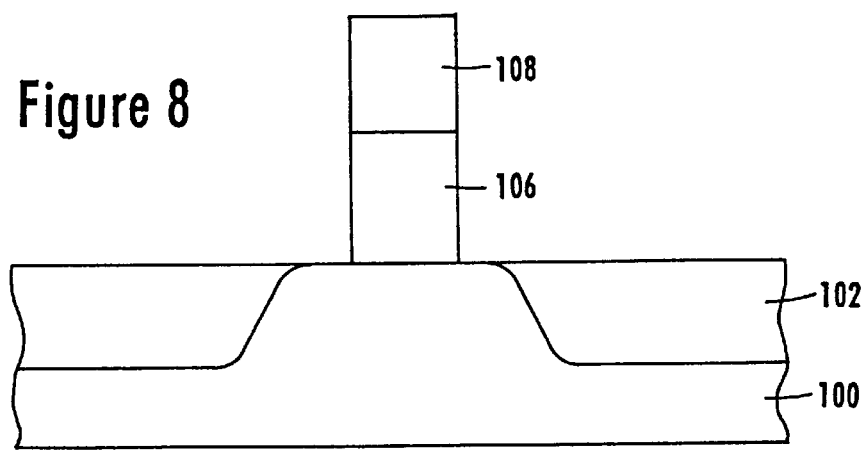
FIG. 8 depicts a semiconductor die wafer of FIG. 7 after the mask has been removed from the nitride layer.
Figure 9:
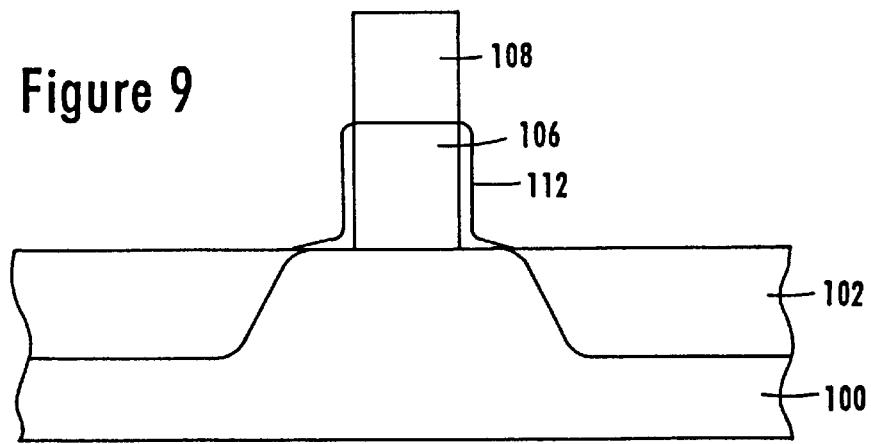
FIG. 9 depicts the semiconductor die wafer of FIG. 8 after a thermal re-oxidation on a polysilicon gate.

In FIG. 6, a patterned photoresist mask 110 that forms the gate mask is provided over the gate region. A complete etching is then performed, the results of this etching being depicted in FIG. 7. The etching removes the nitride and polysilicon except in the area underneath the mask 110. This etching may be anisotropic etch, such as a reactive ion etch (RIE). The mask is then removed, as depicted in FIG. 8, and a thermal oxidation process is performed to grow a thermal oxide layer 112 on the polysilicon 106 (FIG. 9) to protect this polysilicon in further processing steps. Oxide will also grow on the silicon opening which is at this time covered by the gate oxide 104 only.

Figure 10:
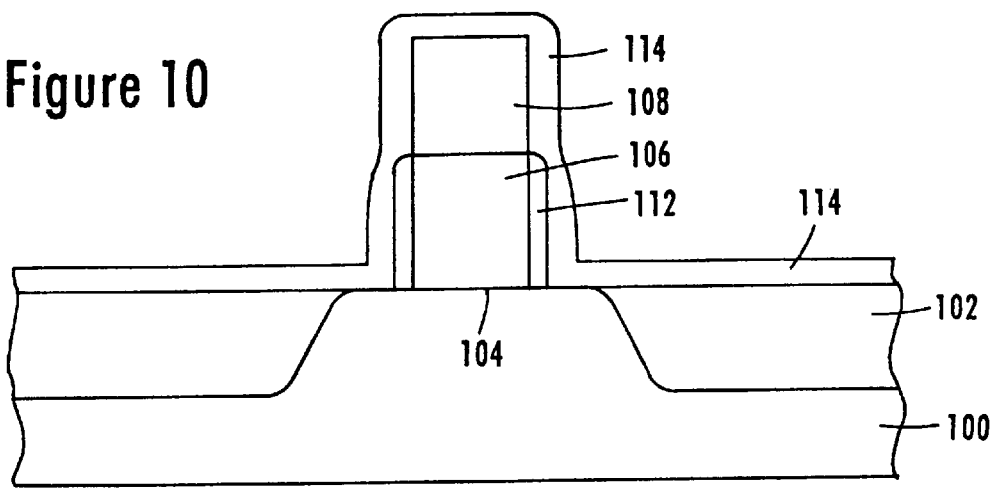
FIG. 10 depicts the semiconductor die wafer of FIG. 9 after low-temperature oxide has been deposited to create a spacer.
Figure 11:
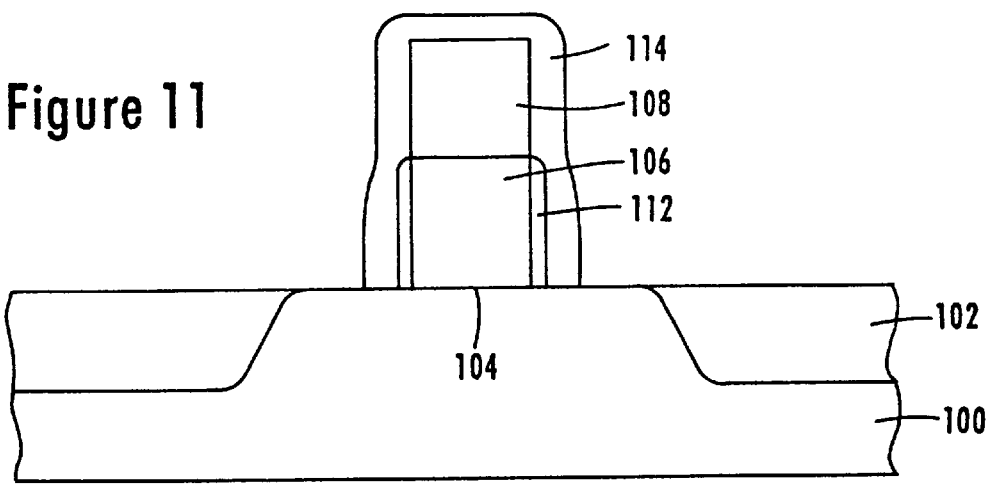
FIG. 11 depicts the semiconductor die wafer of FIG. 10 after the oxide has been etched back.

In FIG. 10, a layer of oxide 114 is deposited. The oxide layer 114 covers the nitride 108, the polysilicon 106 and the field oxide 102. This oxide 114 is then etched back to create sidewall spacer, as depicted in FIG. 11. This process step is skipped in certain embodiments if the layer of oxide 112 is sufficiently thick.

Figure 12:
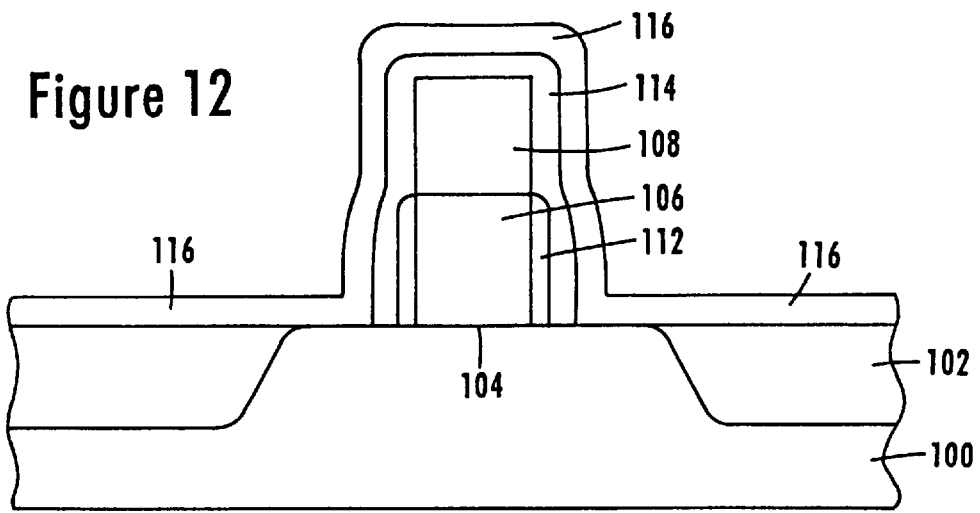
FIG. 12 depicts the semiconductor die wafer of FIG. 11 after amorphous silicon or polysilicon has been deposited.
Figure 13:
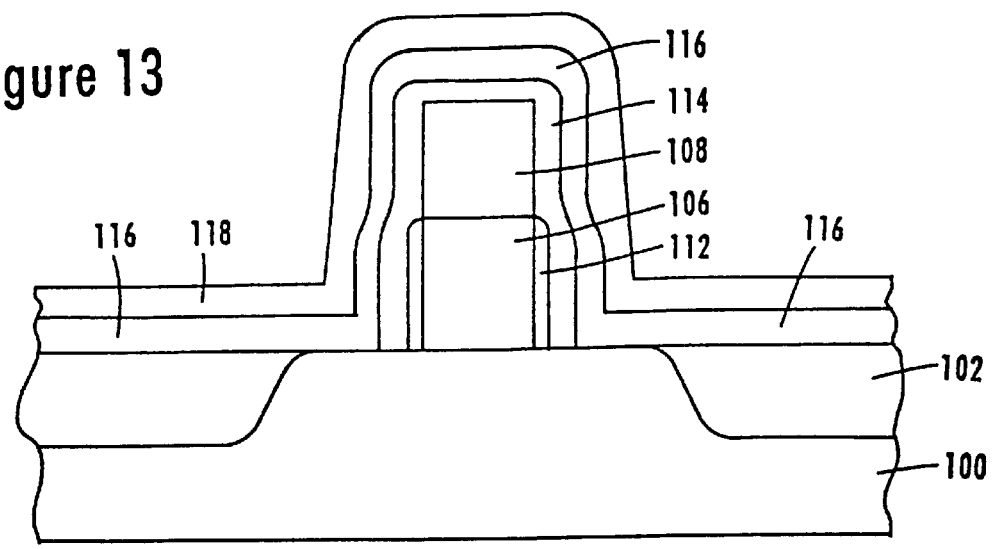
FIG. 13 depicts the semiconductor die wafer of FIG. 12 after a nitride layer has been deposited.
Figure 14:
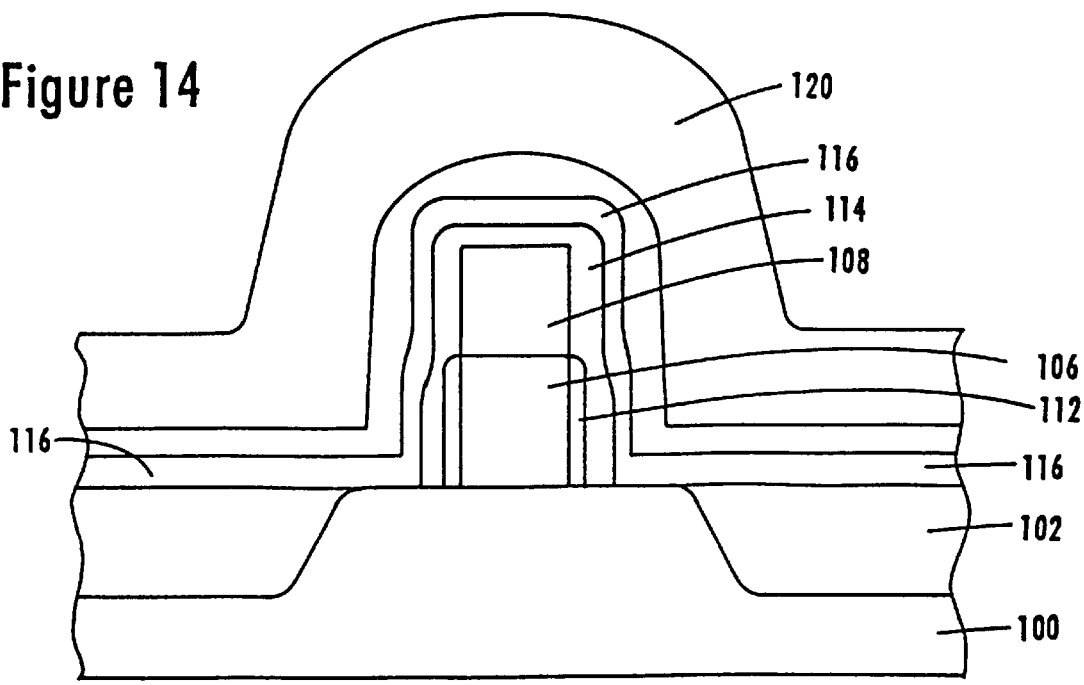
FIG. 14 depicts the semiconductor die wafer of FIG. 13 after a thick polysilicon layer has been deposited.

In FIG. 12, amorphous silicon or polysilicon 116 is deposited over the oxide 114 and the field oxide 102. Another layer of nitride 118 is then deposited over the polysilicon layer 116, as depicted in FIG. 13. Following the depositing of the nitride layer 118, a thick layer of polysilicon 120 is deposited over the nitride layer 118 (FIG. 14). The thick polysilicon layer 120 is needed to fill the space between adjacent (at this point relatively high) polysilicon 106 and nitride 108 stacks. It is undesirable to etch the gate polysilicon during CMP, so the thick nitride capping layer 108 is provided.

Figure 15:
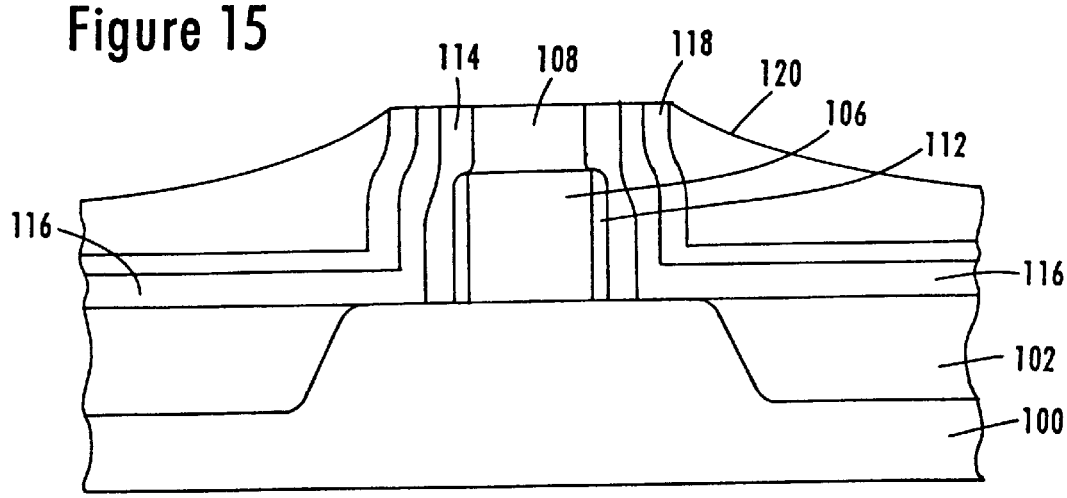
FIG. 15 depicts the semiconductor die wafer of FIG. 14 after chemical mechanical planarization has been performed.
Figure 16:
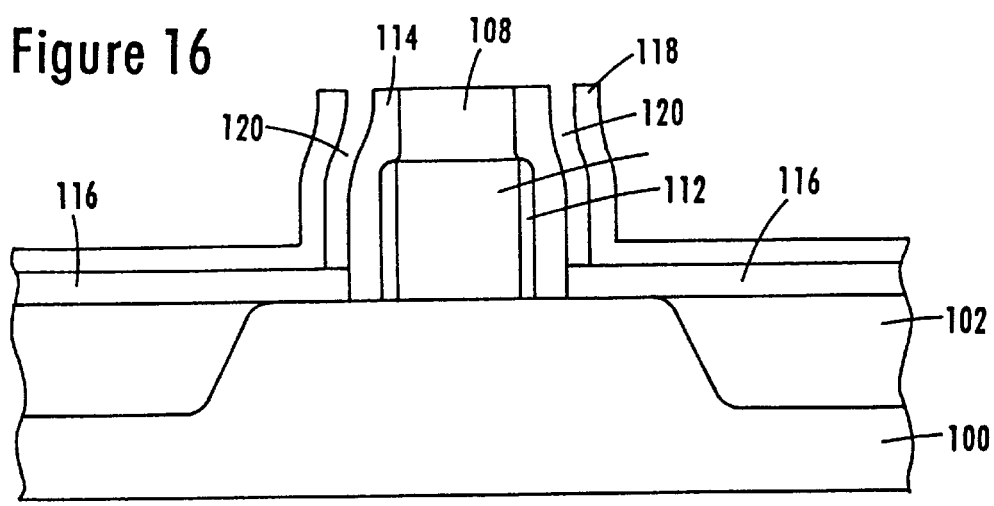
FIG. 16 depicts the semiconductor die wafer of FIG. 15 after an anisotropic etching of the polysilicon to clear polysilicon from spacer sidewalls.

The chemical mechanical planarization process is performed, leaving the structure of FIG. 15. The chemical mechanical planarization process is a global planarization. An anisotropic etch, such as reactive ion etch, is then performed, resulting in the structure of FIG. 16. The anisotropic etch removes the polysilicon 116 from outside of the device and from the spacer 114 sidewall. The anisotropic etching therefore creates vertical wells 120 formed between the nitride 118 and the oxide 114 on either side of the polysilicon gate 106. The anistropic etching process is stopped prior to the removal of the polysilicon 116 down to the substrate 100. This may be done by monitoring the outflowing etching gas composition during the anisotropic etching process and stopping the etching when the large areas above 102 are cleared of polysilicon. This clearing will cause the change of chemical composition of the etching gas indicating that large areas have been cleared and that only the slight timed overetch needs to be done.

Figure 17:
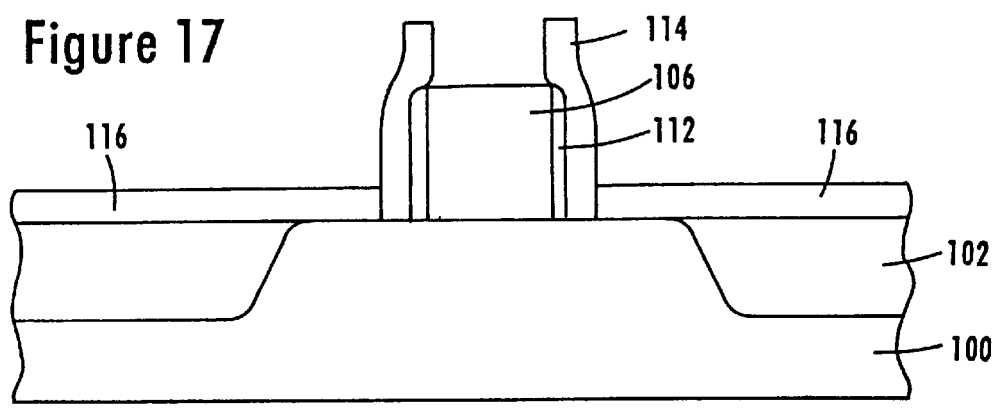
FIG. 17 depicts the semiconductor die wafer of FIG. 16 after the nitride is removed.
Figure 18:
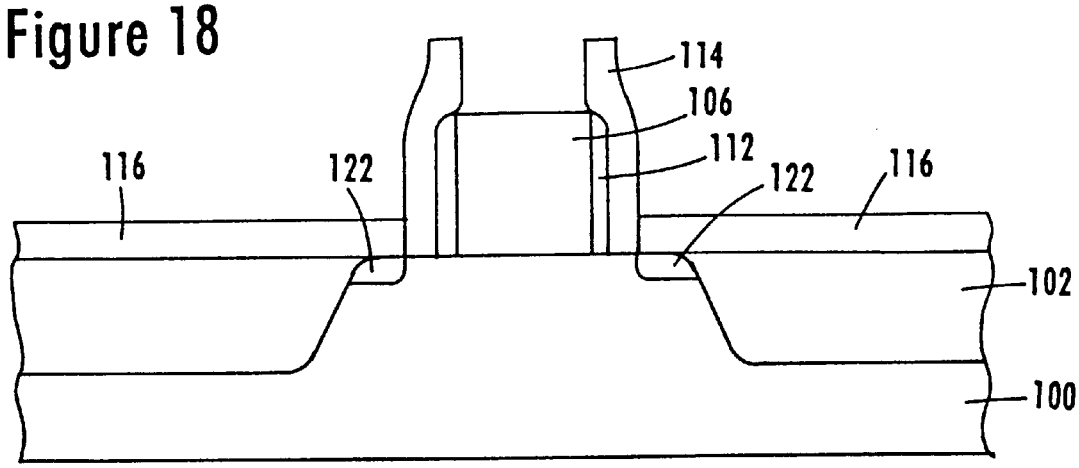
FIG. 18 depicts the semiconductor die wafer of FIG. 17 after heavy source/drain implanting.
Figure 19:
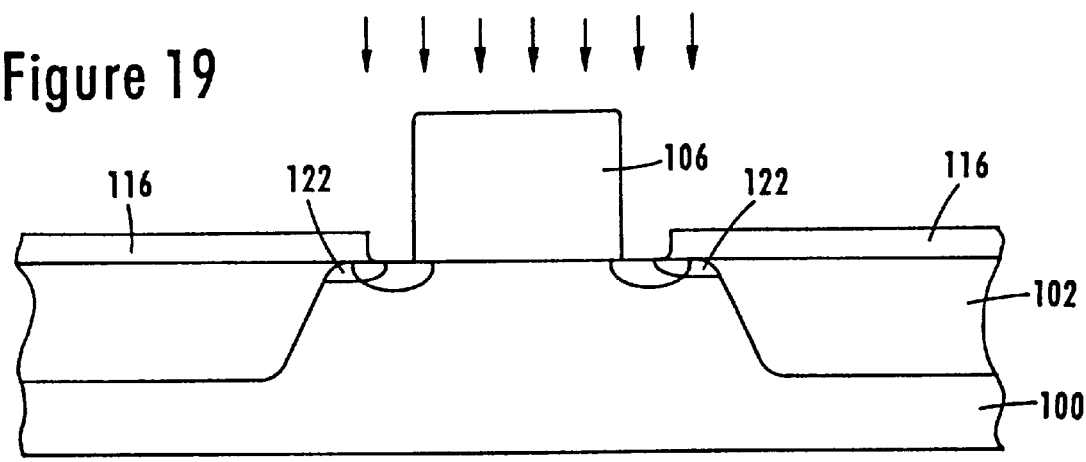
FIG. 19 depicts the semiconductor die wafer of FIG. 20 after the low-temperature oxide forming the spacer has been removed and LDD extensions of source/drain regions are implanted.

The nitride 118 is then removed, resulting in the structure of FIG. 17. A heavy source/drain implanting step is then performed to dope the amorphous or polysilicon layer 116, as depicted in FIG. 18. The oxide 114 surrounding the polysilicon 106 is then removed by isotropic etching, resulting in the structure of FIG. 19. At this stage, LDD implants 122 can be done if desired. If not, spacers 114 can be left and processing can continue from FIG. 22. These can be done as 0-degree tilt implants without wafer rotation, or as non-0-degree tilted implants but with wafer rotation to avoid a beam shadowing (by the gate) effect which would result in asymmetric doping of the device.

Figure 20:
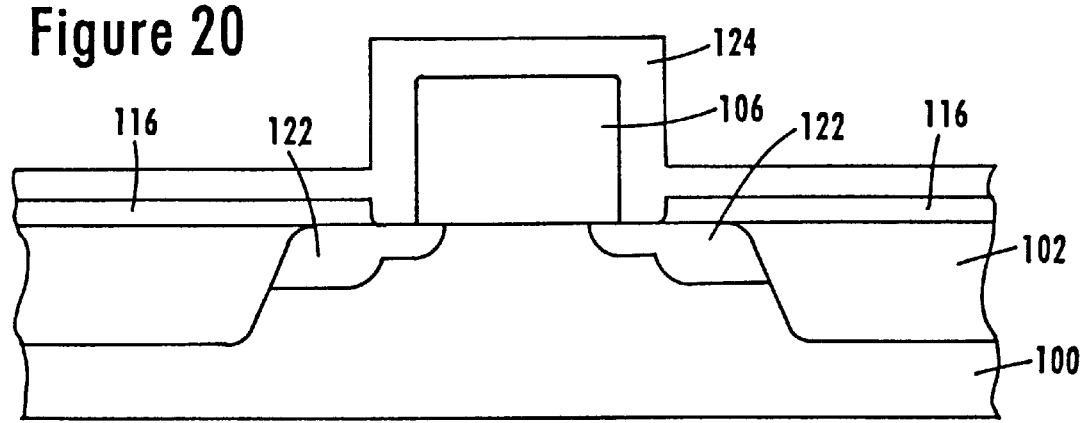
FIG. 20 depicts the semiconductor die wafer of FIG. 19 after a low-temperature oxide has been deposited.

FIG. 20 depicts the structure of the semiconductor die wafer after a low-temperature oxide 124 has been deposited on the polysilicon 106 and the polysilicon layer 116. A rapid thermal anneal or furnace anneal is then performed. The rapid thermal anneal, employed in preferred embodiments of the present invention, provides a temperature that is high enough to achieve a desired amount of transfer of dopant from the polysilicon layer 116 to the substrate 100. The polysilicon layer 116 therefore acts as a diffusion source.

Figure 21:
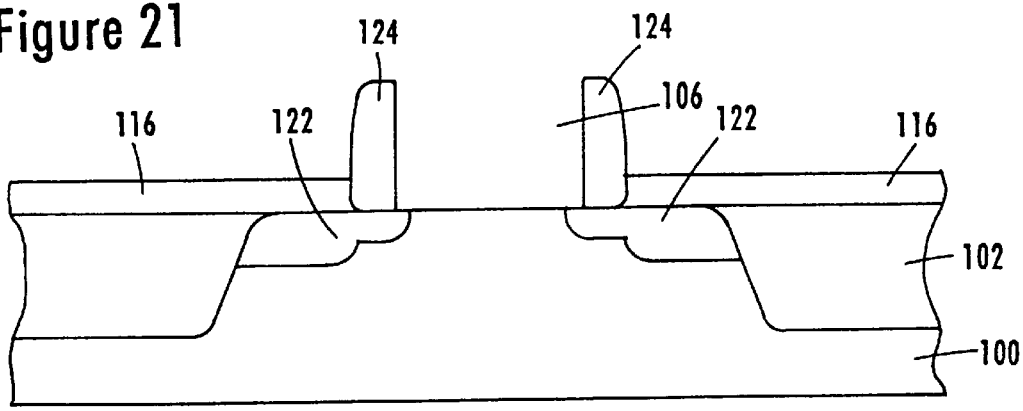
FIG. 21 depicts the semiconductor die wafer of FIG. 20 after a rapid thermal annealing and etching back of the spacer are performed.
Figure 22:
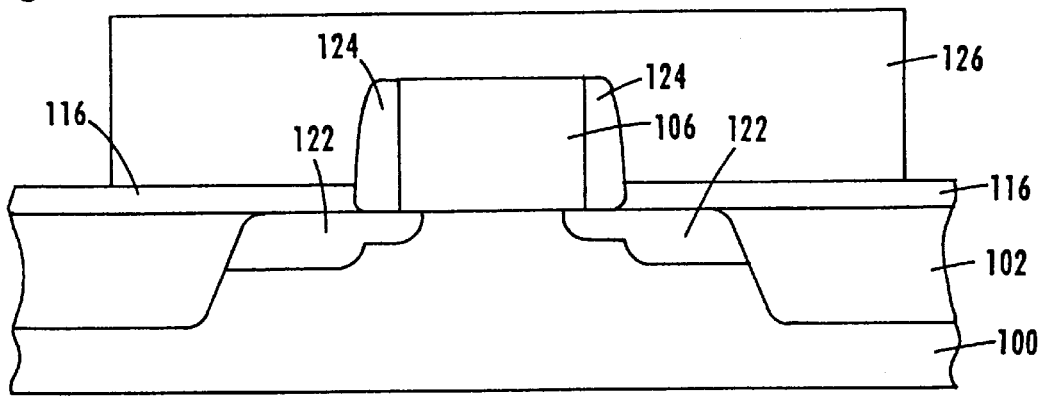
FIG. 22 depicts the semiconductor die wafer of FIG. 21 after a mask has been deposited.
Figure 23:
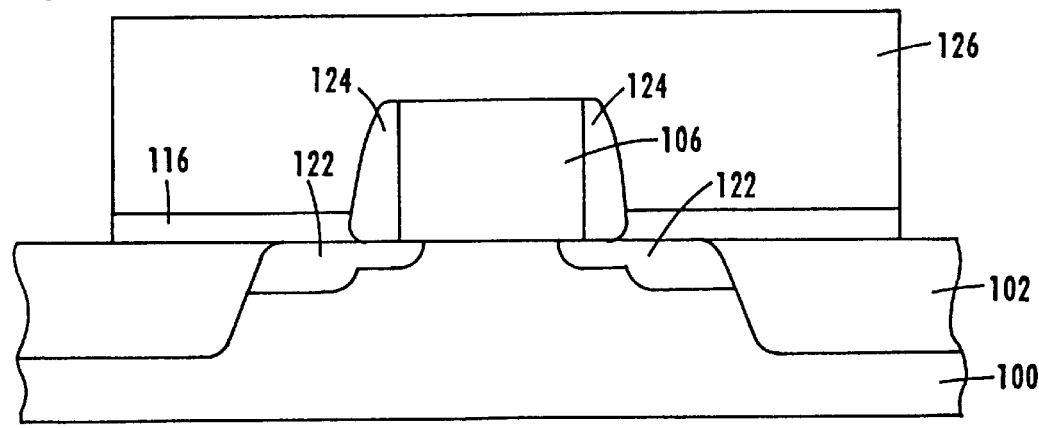
FIG. 23 depicts the semiconductor die wafer of FIG. 22 after etching of the polysilicon according to the mask pattern.

The low-temperature oxide 124 is then etched back, this low-temperature oxide 124 now acting as a spacer between the polysilicon 106 and the polysilicon layer 116. The resulting structure is depicted in FIG. 21. A photoresist is then applied over the device and patterned by mask to provide the structure of FIG. 22. The device is mostly covered, with outer portions of the polysilicon layer 116 exposed. The polysilicon layer 116 is then etched in accordance with the mask pattern to separate the polysilicon layer 116 from other areas of the polysilicon layer 116. Thus, polysilicon straps are formed that contact the source and drain. This is depicted in FIG. 23.

Figure 24:
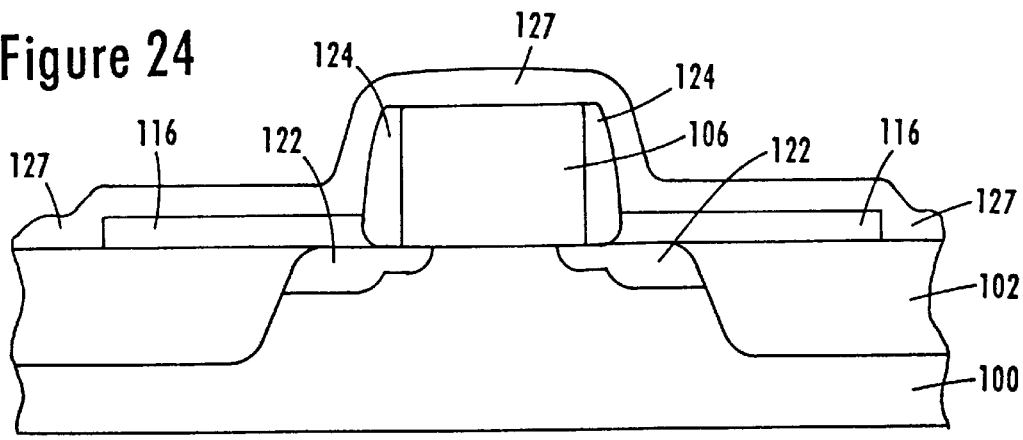
FIG. 24 depicts the semiconductor die wafer of FIG. 23 after removal of the mask and depositing of a silicide-forming metal layer.

In FIG. 24, the photoresist mask 126 is removed and titanium or any other metal used to create a silicide is deposited. The titanium layer has reference numeral 127. The polysilicon is then silicided to grow silicide (e.g., titanium silicide) straps 130 and a titanium silicide area 128 over the polysilicon 106. This structure is depicted in FIG. 25. In FIG. 26, the titanium layer 127 is removed. The semiconductor device may then be processed further in accordance with conventional semiconductor processing techniques. For example, metal layers can be deposited, masked, and etched to form line traces and trenches among the devices, or for connecting to external connections.

The method and resulting structure of the present invention has a number of different advantages. For example, the use of titanium silicide on top of the device allows for ultra-short source and drain areas, so that leakage and capacitance are reduced (through the reduction of junction area) in comparison to prior art devices. Also, the silicided poly layer which was used as a reservoir for source and drain dopant material before silicidation, has not served this purpose before in prior art MOS devices. A further advantage of the present invention is the ability to use the titanium silicide straps 130 as interconnections between devices. Thus, the titanium silicide straps 130 serve both as diffusion sources (while they were polysilicon straps) and device interconnects after silicidation.

Another feature of the present invention is the self-aligning of the polysilicon straps with respect to the gate, according to exemplary embodiments of the present invention. Self-aligning avoids the need for using a second mask to create the silicide straps, in addition to the first mask used to create the gate. Mask alignment precision is extremely difficult to achieve, so that it is likely that the first (gate mask) and second (polysilicon-strap etch) masks will be misaligned in the prior art techniques. This will cause some areas not to be doped properly. However, through the processing steps depicted in FIGS. 12–17, the silicide straps are formed symmetrically around the gate without the use of a mask (i.e., self-aligned). The source and drain will therefore be precisely positioned with respect to the gate without the use of the additional mask.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method of forming a semiconductor device, comprising the steps of:
    forming a gate on a substrate;
    forming a consumable self-aligned diffusion source on the substrate;
    siliciding the diffusion source; and
    diffusing dopant material into the substrate from the diffusion source, the diffusion source becoming substantially consumed during the silicidation.

2. The method of claim 1, wherein the step of forming a self-aligned diffusion source includes depositing oxide over the gate, and depositing at least one of polysilicon and amorphous silicon over the oxide, the oxide separating the polysilicon from the gate by an approximately equal amount on both sides of the gate.

3. The method of claim 2, wherein the step of forming a self-aligned diffusion source further includes removing the polysilicon from the oxide, and subsequently removing the oxide from the gate.

4. The method of claim 3, wherein the step of diffusing dopant material includes performing rapid thermal annealing to transfer dopant material from the polysilicon to the substrate.

5. The method of claim 4, further comprising removing portions of the polysilicon after the rapid thermal annealing to create polysilicon straps separate from remaining portions of the polysilicon.

6. The method of claim 5, further comprising depositing a metal on the polysilicon straps and siliciding the polysilicon to form silicide interconnect straps, the silicide interconnect straps respectively conductively coupled to source and drain regions of the semiconductor device and providing an interconnect between the semiconductor device and other semiconductor devices.

7. The method of claim 6, wherein the step of depositing a metal includes depositing a silicide-forming metal on the polysilicon straps, and wherein siliciding the polysilicon forms interconnect straps.

8. The method of claim 4, wherein the step of forming the self-aligned diffusion source further includes the steps of depositing nitride over the polysilicon, depositing another layer of polysilicon over the nitride, and performing chemical mechanical planarization, prior to removing the polysilicon from the oxide.

9. The method of claim 8, wherein the step of removing the polysilicon from the oxide includes anisotropic etching of the polysilicon.

10. The method of claim 9, further comprising the steps of removing the nitride after the polysilicon has been anisotropically etched and performing source/drain implantation with at least one of zero degree tilt and no wafer rotation or non-zero-degree tilt and wafer rotation.

11. A method of forming a complementary metal-oxide semiconductor device, comprising:
    forming a gate on a substrate;
    forming lightly doped drain structures in the substrate;
    forming a polysilicon diffusion source on the substrate, the diffusion source being self-aligned with respect to the gate, by the steps of depositing oxide over the gate and depositing at least one of polysilicon and amorphous silicon over the oxide, the oxide separating the polysilicon from the gate by an approximately equal amount on both sides of the gate;
    diffusing dopant material from the polysilicon diffusion source into the substrate;
    removing the polysilicon or amorphous silicon from the oxide; and
    subsequently removing the oxide from the gate.

12. The method of claim 11, wherein the step of diffusing dopant material includes rapid thermal annealing.

13. The method of claim 11, wherein the step of diffusing dopant material includes furnace annealing.

14. The method of claim 11, further comprising removing portions of the polysilicon to form polysilicon straps, depositing a metal on the polysilicon straps and siliciding the polysilicon straps to form silicide interconnect straps, the silicide interconnect straps respectively coupled to source and drain regions of the metal-oxide semiconductor device and providing an interconnect between the metal-oxide semiconductor device and other semiconductor devices.

15. A method of making a semi-conductor device having low source-gate and drain-gate capacitances, comprising the steps of:
    forming a gate having sidewalls;
    providing oxide on the sidewalls of the gate;

depositing at least one of amorphous silicon and polysilicon over the oxide on the sidewalls of the gate;

depositing a layer of nitride over the at least one of amorphous silicon and polysilicon;

depositing a layer of polysilicon over the layer of nitride;

performing chemical mechanical planarization; and etching the at least one of amorphous silicon and polysilicon to remove substantially of all the amorphous silicon or polysilicon contacting the oxide on the sidewalls of the gate.

16. The method of claim 15, wherein the etching is an anisotropic etching.

17. The method of claim 15, wherein the step of providing oxide on the sidewalls of the gate includes oxidizing the sidewalls of the gate.

18. The method of claim 15, wherein the step of providing oxide on the sidewalls of the gate includes depositing oxide on the sidewalls of the gate.

* * * * *